(12) United States Patent
Hu

(10) Patent No.: US 10,002,551 B2
(45) Date of Patent: Jun. 19, 2018

(54) BENDABLE DISPLAY DEVICE

(71) Applicant: BOE TECHNOLOGY GROUP CO., LTD., Beijing (CN)

(72) Inventor: Nannan Hu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days. days.

(21) Appl. No.: 15/531,068

(22) PCT Filed: Sep. 27, 2016

(86) PCT No.: PCT/CN2016/100355
§ 371 (c)(1),
(2) Date: May 26, 2017

(87) PCT Pub. No.: WO2017/118116
PCT Pub. Date: Jul. 13, 2017

(65) Prior Publication Data
US 2018/0047313 A1 Feb. 15, 2018

(30) Foreign Application Priority Data

Jan. 5, 2016 (CN) .......................... 2016 1 0005905

(51) Int. Cl.
*G06F 1/16* (2006.01)
*G09F 9/30* (2006.01)
(Continued)

(52) U.S. Cl.
CPC ................ *G09F 9/301* (2013.01); *G02F 1/13* (2013.01); *H04M 1/0268* (2013.01);
(Continued)

(58) Field of Classification Search
CPC ... G06F 1/1601; G06F 1/1652; H05K 5/0008; H05K 5/0017; G09F 9/301; G09F 9/302
See application file for complete search history.

(56) References Cited

U.S. PATENT DOCUMENTS 8,259,931 B2   9/2012   Wu et al.
8,411,223 B2   4/2013   Tsuji et al.
(Continued)

FOREIGN PATENT DOCUMENTS

CN   101840092 A   9/2010
CN   102056444 A   5/2011
(Continued)

OTHER PUBLICATIONS

Chinese Office Action in Chinese Application No. 201610005905.7, dated Jul. 27, 2017 with English translation.
(Continued)

*Primary Examiner* — Anthony Q Edwards
(74) *Attorney, Agent, or Firm* — Collard & Roe, P.C.

(57) ABSTRACT

A bendable display device including a backplate and a circuit board card arranged opposite to the backplate is provided. Among four corner portions of the circuit board card, a first corner portion and a second corner portion are adjacent to each other and are respectively fixedly installed on the backplate. The backplate is provided with two sliding grooves respectively arranged corresponding to a third corner portion and a fourth corner portion of the circuit board card, a sliding block is arranged in each sliding groove, and a height of the sliding block is less than a depth of the sliding groove. The bendable display device further includes installing columns corresponding to the sliding grooves one to one, a first end of each installing column is connected with the sliding block in the sliding groove, and a second end of each installing column is connected with the circuit board card.

15 Claims, 2 Drawing Sheets

(51) Int. Cl.
*H04M 1/02* (2006.01)
*H05K 1/02* (2006.01)
*H05K 1/14* (2006.01)
*G02F 1/13* (2006.01)
*H05K 1/18* (2006.01)

(52) U.S. Cl.
CPC ............ *H05K 1/028* (2013.01); *H05K 1/0278* (2013.01); *H05K 1/147* (2013.01); *H05K 1/148* (2013.01); *H05K 1/181* (2013.01); *H05K 2201/09027* (2013.01)

(56) References Cited

U.S. PATENT DOCUMENTS

| | | | |
|---|---|---|---|
| 9,253,913 | B2 | 2/2016 | Yu et al. |
| 9,320,138 | B2 | 4/2016 | Lee et al. |
| 9,395,758 | B2 * | 7/2016 | Zhang ................... G06F 1/1601 |
| 9,536,456 | B2 * | 1/2017 | Kang ....................... G09F 9/301 |
| 9,576,510 | B2 * | 2/2017 | Ren .......................... G09F 9/301 |
| 9,608,231 | B2 | 3/2017 | Lee et al. |
| 9,711,752 | B2 | 7/2017 | Lee et al. |
| 2013/0010405 | A1 * | 1/2013 | Rothkopf ............ H04M 1/0216 361/679.01 |
| 2013/0127700 | A1 | 5/2013 | Hsiao et al. |
| 2013/0155655 | A1 * | 6/2013 | Lee ........................... H05K 5/03 362/97.1 |
| 2013/0207946 | A1 * | 8/2013 | Kim ..................... G09G 3/3225 345/204 |
| 2014/0118910 | A1 * | 5/2014 | Sung ........................ G09F 9/301 361/679.01 |
| 2014/0268584 | A1 * | 9/2014 | Song ......................... H05K 7/02 361/728 |
| 2015/0257290 | A1 * | 9/2015 | Lee ..................... H04M 1/0216 361/749 |
| 2016/0050772 | A1 * | 2/2016 | Park ......................... H04N 5/64 361/807 |
| 2016/0295711 | A1 * | 10/2016 | Ryu ....................... G09F 9/301 |
| 2017/0075459 | A1 * | 3/2017 | Kauhaniemi ......... G06F 3/0412 |
| 2017/0124937 | A1 * | 5/2017 | Kim ..................... G09G 3/2096 |

FOREIGN PATENT DOCUMENTS

| | | |
|---|---|---|
| CN | 102418910 A | 4/2012 |
| CN | 103458646 A | 12/2013 |
| CN | 103814403 A | 5/2014 |
| CN | 104217650 A | 12/2014 |
| CN | 204143110 U | 2/2015 |
| CN | 105427751 A | 3/2016 |
| WO | 2016108296 A1 | 7/2016 |

OTHER PUBLICATIONS

International Search Report for PCT/CN2016/100355 in Chinese, dated Jan. 5, 2017 with English translation.
Notice of Transmittal of the International Search Report in Chinese, dated Jan. 5, 2017.
Written Opinion of International Searching Authority for PCT/CN2016/100355 in Chinese, dated Jan. 5, 2017 with English translation.

* cited by examiner though the circuit board card tends to keep flat, and therefore a relatively great interaction force is generated between the circuit board card and the bent backplate, and a force from the bent backplate on the circuit board card acts on the circuit board card through the positioning columns at the four corner portions. In the case the bendable display device is bent, the circuit board card bears the force of the positioning columns all the time till the bendable display device resumes to be a flat panel display device. Thus, in the bendable display device, the circuit board card is damaged quite easily, which thus causes defect.
BENDABLE DISPLAY DEVICE

CROSS REFERENCE TO RELATED APPLICATIONS

This application is the National Stage of PCT/CN2016/100355 filed on Sep. 27, 2016, which claims priority under 35 U.S.C. § 119 of Chinese Application No. 201610005905.7 filed on Jan. 5, 2016, the disclosure of which is incorporated by reference.

TECHNICAL FIELD

Embodiments of the present disclosure relate to a bendable display device.

BACKGROUND

Currently, a curved display device with a curved display surface has become a popular tendency, and a screen of the curved display device is in a shape of arc. However, a viewing angle of the curved display device is small, and thus the curved display device is only suitable for being viewed by a few people, and is not applicable in the case that it is viewed by many people. Thus, some bendable display devices are generated; and the bendable display device is bendable to be in the shape of arc so as to make the screen thereof freely switched between a plane state and a curved state with a small curvature.

In the bendable display device, four corner portions of a circuit board card are fixed to positioning columns of a backplate. In the case the bendable display device is bent into the shape of arc, a bending performance of the circuit board card is very bad and the circuit board card tends to keep flat, and therefore a relatively great interaction force is generated between the circuit board card and the bent backplate, and a force from the bent backplate on the circuit board card acts on the circuit board card through the positioning columns at the four corner portions. In the case the bendable display device is bent, the circuit board card bears the force of the positioning columns all the time till the bendable display device resumes to be a flat panel display device. Thus, in the bendable display device, the circuit board card is damaged quite easily, which thus causes defect.

SUMMARY

According to embodiments of the disclosure, a bendable display device comprising a backplate and a circuit board card arranged opposite to the backplate is provided. Among four corner portions of the circuit board card, a first corner portion is adjacent to a second corner portion, and the first corner portion and the second corner portion are respectively fixedly installed on the backplate; the backplate is provided with two sliding grooves, the two sliding grooves are respectively arranged corresponding to a third corner portion and a fourth corner portion of the circuit board card, a sliding block is arranged in each sliding groove, and a height of the sliding block is less than a depth of the sliding groove; and the bendable display device further comprises installing columns corresponding to the sliding grooves one to one, a first end of each installing column is connected with the sliding block in the sliding groove corresponding to the installing column, and a second end of each installing column is connected with the circuit board card.

For example, each sliding groove extends in a direction towards a side edge of the circuit board card sandwiched between the first corner portion and the second corner portion.

For example, two side surfaces of the sliding block with extending directions parallel with an extending direction of the sliding groove are respectively in contact with side walls of two sides of the sliding groove.

For example, the backplate is provided with two positioning columns respectively arranged corresponding to the first corner portion and the second corner portion of the circuit board card, and the first corner portion and the second corner portion of the circuit board card are respectively fixedly connected with the positioning columns arranged corresponding thereto.

For example, each positioning column is a protrusion protruding in a direction from the backplate to the circuit board card.

For example, the second end of each installing column is provided with a threaded hole, and each installing column is connected with the circuit board card through a screw.

For example, each installing column is provided with a limiting plate arranged perpendicular to an axis line of the installing column, and the limiting plate is located between the circuit board card and the sliding groove.

For example, the first end of each installing column is connected with the sliding block in the sliding groove corresponding to the installing column in a clamped connection manner.

For example, a side wall of each installing column is provided with a limiting pin matched with the sliding block in the sliding groove corresponding to the installing column in an inserted connection manner, so that the installing column and the sliding block are fixed with each other in a direction perpendicular to an axis line of the installing column.

For example, the sliding groove is a groove formed by the backplate protruding towards the circuit board card, and a bottom of the groove is provided with an opening so as to form an opening of the sliding groove.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1:
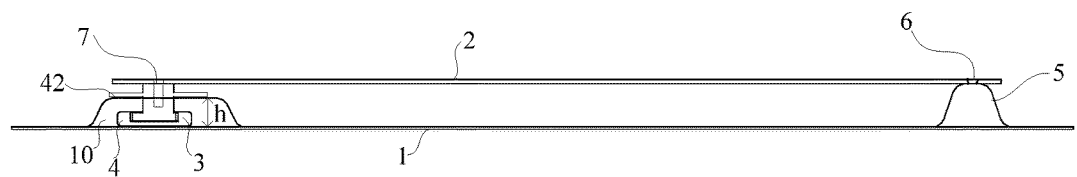
FIG. 1 is a sectional schematic view in the case a backplate and a circuit board card of a bendable display device provided by embodiments of the present disclosure are not bent.
Figure 2:
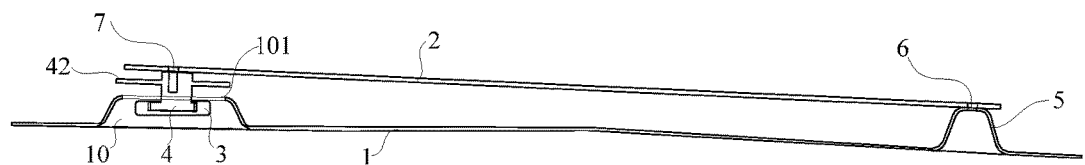
FIG. 2 is a sectional schematic view in the case the backplate and the circuit board card of the bendable display device provided by the embodiments of the present disclosure are bent.
Figure 3:
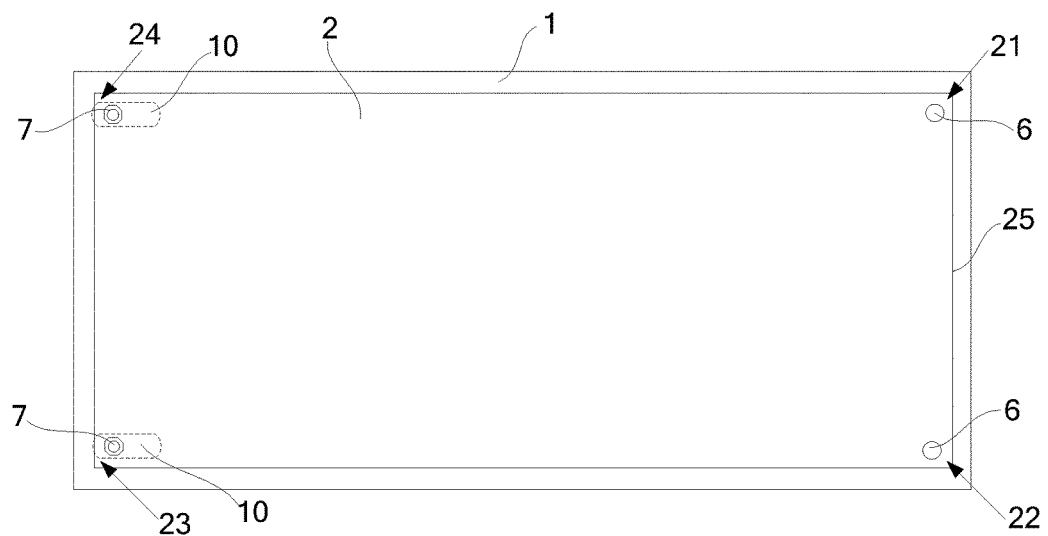
FIG. 3 is a planar schematic view illustrating the backplate and the circuit board card of the bendable display device provided by the embodiments of the present disclosure.

As shown in FIGS. 1 to 3, embodiments of the present disclosure provide a bendable display device, comprising a backplate 1 and a circuit board card 2 arranged opposite to the backplate 1. Among four corner portions of the circuit board card 2, a first corner portion 21 and a second corner portion 22 are adjacent to each other and are respectively fixedly installed on the backplate 1. The backplate 1 is provided with two sliding grooves 10, the two sliding grooves 10 are respectively arranged corresponding to a third corner portion 23 and a fourth corner portion 24 of the circuit board card; a sliding block 3 is arranged in each sliding groove 10, and a height of the sliding block 3 is less than a depth h of the sliding groove 10.

The bendable display device further comprises installing columns 4 corresponding to the sliding grooves 10 one to one, a first end of each installing column 4 is connected with the sliding block 3 in the sliding groove 10 corresponding to the installing column 4, and a second end of each installing column 4 is connected with the circuit board card 2.

As shown in FIG. 3, in the above bendable display device, the first corner portion 21 and the second corner portion 22 of the circuit board card are fixed to the backplate 1 so that a side edge (i.e. a first side edge 25) sandwiched between the first corner portion 21 and the second corner portion 22 of the circuit board card 2 is fixed with respect to the backplate 1; and the other two corner portions, namely the third corner portion 23 and the fourth corner portion 24, of the circuit board card 2 are respectively arranged corresponding to the two sliding grooves 10 provided on the backplate 1, and are in sliding fit connection with the sliding grooves 10 through the installing columns 4 and the sliding blocks 3. In addition, as shown in FIG. 1, the height of the sliding block 3 is less than the depth of the sliding groove 10, that is to say, the sliding block 3 is capable of moving in an up-down direction with respect to the sliding groove 10; thus, as shown in FIG. 2, in the case the bendable display device is bent and the third corner portion 23 and the fourth corner portion 24 of the circuit board card 2 tend to move in a direction of leaving away from the backplate 1, the sliding blocks 3 in the two sliding grooves 10 are respectively driven by the third corner portion 23 and the fourth corner portion 24 to move in a direction towards a top opening 101 of the sliding groove 10 so that the circuit board card 2 finally does not generate deformation or only generates small deformation. Thus, in the case that the bendable display device according to the embodiments of the present disclosure is bent, no interaction force is generated between the circuit board card 2 and the bent backplate 1 or only a relatively small interaction force is generated between the circuit board card 2 and the bent backplate 1, and therefore the circuit board card 2 does not bear a force from the backplate 1 or only bears a relatively small force from the backplate 1. Thus, the circuit board card of the bendable display device is not prone to being damaged, and then defect is not prone to being generated.

As shown in FIG. 3, for example, each sliding groove 10 extends in a direction towards the side edge (namely the side edge 25) sandwiched between the first corner portion 21 and the second corner portion 22 of the circuit board card 2.

As shown in FIG. 2, in the case that the bendable display device is bent with respect to a straight line parallel with the first side edge 25, the sliding blocks 3 in the two sliding grooves 10 are respectively driven by the third corner portion 23 and the fourth corner portion 24 of the circuit board card 2 to move in the direction towards the top opening 101 of the sliding groove 10 and in an extending direction of the sliding groove 10, then it can be better avoided that the circuit board card 2 generates deformation, and therefore the circuit board card 2 does not bear a force from the backplate 1 or only bears a relatively small force from the backplate 1 in a bending process of the bendable display device.

Figure 4:
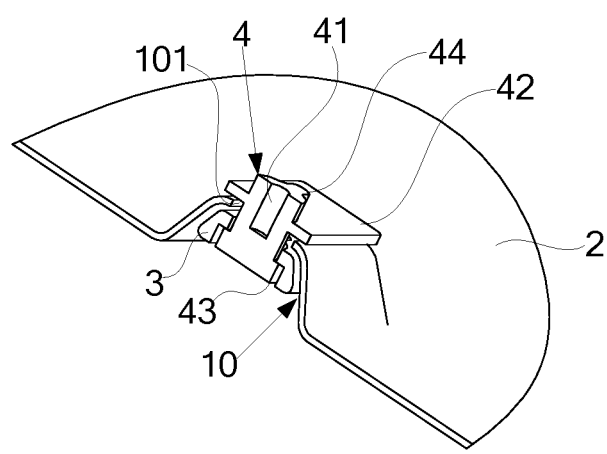
FIG. 4 is a structural schematic view illustrating a sliding groove provided on the backplate of the bendable display device provided by the embodiments of the present disclosure.

As shown in FIG. 4, for example, for the sliding block 3 located in the sliding groove 10, two side surfaces (for example, two side surfaces with extending directions parallel with the extending direction of the sliding groove 100) are respectively in contact with side walls of two sides of the sliding groove 10.

As shown in FIG. 2 and FIG. 4, for example, in a direction perpendicular to the extending direction of the sliding groove 10, a width of each installing column 4 is equal to a width of the opening 101 of the sliding groove 10 corresponding to the installing column 4.

By means of the above arrangements of the sliding blocks 3 and the installing columns 4, it can be guaranteed that the sliding blocks 3 and the installing columns 4 move in the extending direction of the sliding groove 10 and in the direction towards the top opening 101 of the sliding groove 10, and thus it can be avoided that the third corner portion 23 and the fourth corner portion 24 of the circuit board card 2 move in other directions with respect to the backplate 1 in the case the bendable display device is bent, which thus results in better stability of the circuit board card 1. In addition, the above arrangement of the sliding block 3 also avoids that the sliding block 3 rotates in the sliding groove 10, and therefore a connecting operation between the sliding block 3 and the installing column 4 is facilitated.

As shown in FIG. 1 and FIG. 2, on the basis of the above embodiments, for example, in the bendable display device of the embodiments of the present disclosure, the backplate 1 is provided with two positioning columns 5 respectively arranged corresponding to the first corner portion 21 and the second corner portion 22 of the circuit board card 2, and the first corner portion 21 and the second corner portion 22 of the circuit board card 2 are respectively fixedly connected with the positioning columns 5 arranged corresponding to them.

As shown in FIG. 1 and FIG. 2, on the basis of the above embodiments, for example, each positioning column 5 is a protrusion protruding in a direction from the backplate 1 to the circuit board card 2. Furthermore, for example, the first corner portion 21 and the second corner portion 22 of the circuit board card 2 are respectively fixedly connected with the positioning columns 5 arranged corresponding to them through screws or rivets 6.

As shown in FIG. 1, FIG. 2, FIG. 4 and FIG. 5, on the basis of the above embodiments, for example, a second end of each installing column 4 is provided with a threaded hole 41, the circuit board card 2 is provided with a via hole arranged corresponding to the threaded hole 41, the via hole is a hole without a thread or the via hole is a threaded hole, and each installing column 4 and the circuit board card 2 are connected together through a screw 7 passing through the via hole of the circuit board card 2 and in screw thread fit with the threaded hole 41 of the installing column 4.

As shown in FIGS. 1 to 5, on the basis of the above embodiments, for example, each installing column 4 is provided with a limiting plate 42 arranged perpendicular to an axis line of the installing column 4, and the limiting plate 42 is located between the circuit board card 2 and the sliding groove 10 and is configured for limiting the installing column 4.

Because the height of the sliding block 3 is less than the depth of the sliding groove 10, the installing column 4 may fall into the sliding groove 10 in the case the first end of the installing column 4 is connected with the sliding block 3, thereby causing installing inconvenience. Thus, the installing column 4 is limited by the limiting plate 42, which can avoid that the installing column 4 falls into the sliding groove 10, thereby facilitating installation.

Figure 5:
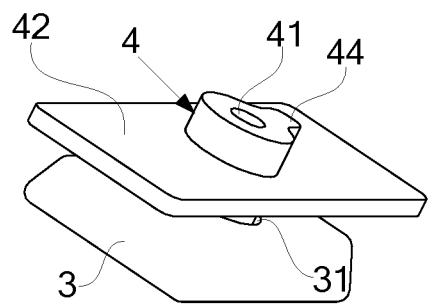
FIG. 5 is a structural schematic view illustrating an installing column of the bendable display device provided by the embodiments of the present disclosure.

As shown in FIG. 4 and FIG. 5, on the basis of the above embodiments, for example, the first end of each installing column 4 is connected with the sliding block 3 in the sliding groove 10 corresponding to the installing column 4 in a clamped connection manner. For example, an edge of the first end of the installing column 4 is provided with a protrusion 43, the sliding block 3 is provided with a groove 31, and the protrusion 43 is engaged with the groove 31 in the clamped connection manner so as to achieve connection of the first end of the installing column 4 and the sliding block 3. Of course, the connection manner of the installing column 4 and the sliding block 3 is not limited to the clamped connection; and the connection of the installing column 4 and the sliding block 3 for example is achieved by installing screws.

As shown in FIG. 4 and FIG. 5, on the basis of the above embodiments, for example, a side wall of each installing column 4 is provided with a limiting pin 44 matched with the sliding block 3 in the sliding groove 10 corresponding to the installing column 4 in an inserted connection manner, the limiting pin 44 makes the installing column 4 limited by the sliding block 3, and therefore the installing column 4 and the sliding block 3 are fixed with each other in a direction perpendicular to the axis line of the installing column 4. Thus, as shown in FIG. 1 and FIG. 2, in a process of connecting the circuit board card 2 with the installing column 4 through the screw 7, because of the limitation of the sliding block 3, it is avoided that the installing column 4 rotates together with the screw 7 in the case the screw 7 is screwed into the threaded hole 41 of the installing column 4, thus connection operation between the circuit board card 2 and the installing column 4 is facilitated.

As shown in FIG. 4, on the basis of the above embodiments, for example, the sliding groove 10 provided on the backplate is a groove formed by the backplate 1 protruding towards the circuit board card 2, and a bottom of the groove is provided with an opening so as to form the opening 101 of the sliding groove 10.

For example, in the embodiments according to the present disclosure, a side of the backplate 1 facing away from the circuit board card 2 is provided with a display panel. For example, the display panel is a liquid crystal display panel, an organic electroluminescent display panel or any other display panel with a display function.

The foregoing embodiments merely are exemplary embodiments of the disclosure, and not intended to define the scope of the disclosure, and the scope of the disclosure is determined by the appended claims.

The present application claims priority of Chinese Patent Application No. 201610005905.7 filed on Jan. 5, 2016, the disclosure of which is incorporated herein by reference in its entirety as part of the present application.

The invention claimed is:

1. A bendable display device, comprising a backplate and a circuit board card arranged opposite to the backplate, wherein, among four corner portions of the circuit board card, a first corner portion is adjacent to a second corner portion, and the first corner portion and the second corner portion are respectively fixedly installed on the backplate;

the backplate is provided with two sliding grooves, the two sliding grooves are respectively arranged corresponding to a third corner portion and a fourth corner portion of the circuit board card, a sliding block is arranged in each sliding groove, and a height of the sliding block is less than a depth of the sliding groove; and the bendable display device further comprises installing columns corresponding to the sliding grooves one to one, a first end of each installing column is connected with the sliding block in the sliding groove corresponding to the installing column, and a second end of each installing column is connected with the circuit board card.

2. The bendable display device according to claim 1, wherein, each sliding groove extends in a direction towards a side edge of the circuit board card sandwiched between the first corner portion and the second corner portion.

3. The bendable display device according to claim 2, wherein, two side surfaces of the sliding block with extending directions parallel with an extending direction of the sliding groove are respectively in contact with side walls of two sides of the sliding groove.

4. The bendable display device according to claim 1, wherein, the backplate is provided with two positioning columns respectively arranged corresponding to the first corner portion and the second corner portion of the circuit board card, and the first corner portion and the second corner portion of the circuit board card are respectively fixedly connected with the positioning columns arranged corresponding thereto.

5. The bendable display device according to claim 4, wherein, each positioning column is a protrusion protruding in a direction from the backplate to the circuit board card.

6. The bendable display device according to claim 1, wherein, the second end of each installing column is provided with a threaded hole, and each installing column is connected with the circuit board card through a screw.

7. The bendable display device according to claim 1, wherein, each installing column is provided with a limiting plate arranged perpendicular to an axis line of the installing column, and the limiting plate is located between the circuit board card and the sliding groove.

8. The bendable display device according to claim 1, wherein, the first end of each installing column is connected with the sliding block in the sliding groove corresponding to the installing column in a clamped connection manner.

9. The bendable display device according to claim 8, wherein, a side wall of each installing column is provided with a limiting pin matched with the sliding block in the sliding groove corresponding to the installing column in an inserted connection manner, so that the installing column and the sliding block are fixed with each other in a direction perpendicular to an axis line of the installing column.

10. The bendable display device according to claim 1, wherein, the sliding groove is a groove formed by the backplate protruding towards the circuit board card, and a bottom of the groove is provided with an opening so as to form an opening of the sliding groove.

11. The bendable display device according to claim 1, wherein, a side of the backplate facing away from the circuit board card is provided with a display panel.

12. The bendable display device according to claim 11, wherein, the display panel is a liquid crystal display panel or an organic electroluminescent display panel.

13. The bendable display device according to claim 4, wherein, the first corner portion and the second corner portion of the circuit board card are respectively fixedly connected with the positioning columns arranged corresponding to them through screws or rivets.

14. The bendable display device according to claim 6, wherein, the circuit board card is provided with a via hole arranged corresponding to the threaded hole, and each installing column is connected with the circuit board card through the screw passing through the via hole of the circuit board card and in screw thread fit with the threaded hole of the installing column.

15. The bendable display device according to claim 8, wherein, an edge of the first end of the installing column is provided with a protrusion, the sliding block is provided with a groove, and the protrusion is engaged with the groove in the clamped connection manner.

\* \* \* \* \*